(12) United States Patent
Sano

(10) Patent No.: US 7,141,442 B2
(45) Date of Patent: Nov. 28, 2006

(54) METHOD FOR MANUFACTURING A LIGHT EMITTING DEVICE

(75) Inventor: Masaki Sano, Yamanashi-ken (JP)

(73) Assignee: Citizen Electronics Co., Ltd, Yamanashi-ken (JP)

( * ) Notice: Subject to any disclaimer, the term of this patent is extended or adjusted under 35 U.S.C. 154(b) by 184 days.

(21) Appl. No.: 10/900,321

(22) Filed: Jul. 28, 2004

(65) Prior Publication Data
US 2006/0040416 A1    Feb. 23, 2006

Related U.S. Application Data

(62) Division of application No. 10/648,224, filed on Aug. 27, 2003.

(30) Foreign Application Priority Data
Aug. 29, 2002  (JP) .............................. 2002-249934

(51) Int. Cl.
*H01L 21/00*    (2006.01)
*H01L 21/66*    (2006.01)

(52) U.S. Cl. .................... 438/26; 438/16; 257/E21.529
(58) Field of Classification Search .................. 438/14, 438/15, 16, 22, 26, 29
See application file for complete search history.

(56) References Cited

U.S. PATENT DOCUMENTS

| | | | |
|---|---|---|---|
| 6,319,425 B1 * | 11/2001 | Tasaki et al. | 252/301.6 |
| 6,686,105 B1 * | 2/2004 | Washizu et al. | 430/7 |
| 6,888,173 B1 * | 5/2005 | Ishii et al. | 257/100 |
| 6,965,191 B1 * | 11/2005 | Koike et al. | 313/112 |

* cited by examiner

*Primary Examiner*—Scott B. Geyer
(74) *Attorney, Agent, or Firm*—Dennison, Schultz & McDonald

(57) ABSTRACT

A method for manufacturing an LED device includes the steps of mounting an LED on a substrate, sealing the LED with a transparent resin including phosphor particles to form an LED device before being dyed, measuring chromaticity of light from the LED device before being dyed; and dyeing the sealing resin by a dye having a color for correcting the measured chromaticity to a desired color.

2 Claims, 12 Drawing Sheets

METHOD FOR MANUFACTURING A LIGHT EMITTING DEVICE

This application is a division of Ser. No. 10/648,224, filed Aug. 27, 2003.

BACKGROUND OF THE INVENTION

The present invention relates to a light emitting diode device having a light emitting diode (LED) as a light source.

In recent years, there has been provided an LED device which may emit white light, and furthermore, an LED device which may emit light of various colors has been proposed.

FIG. 18 is a perspective view of a conventional LED device for emitting white light, FIG. 19 is a sectional view of the LED device.

The white light emitting LED device 120 comprises a substrate 101 having a pair of terminal electrodes 102 and 103 provided on the upper surface and the underside thereof, and an LED 105 for emitting blue or ultraviolet light. The cathode of the LED 105 is connected to the electrode 102 through an adhesive 104, and the anode is connected to the electrode 103 by a bonding wire 106. The LED 105 and the upper surface of the substrate 101 are covered by a transparent resin 107. In the resin 107, yellow phosphor particles 108 are mixed.

When a driving voltage is applied to the terminal electrodes 102 and 103, the LED 105 is excited to emit blue or ultraviolet light S as shown in FIG. 20.

When the blue or ultraviolet light S strikes the phosphor particle 108, the phosphor particle emits yellow light or green light excited from red-green-blue S1. The mixture of the bluish light and the yellowish light takes on white light based on the wavelength conversion.

FIG. 21 is a sectional view showing another conventional LED device 130. The same parts as the conventional LED device of FIGS. 18 and 19 are identified by the same reference numerals as those of FIGS. 18 and 19. In the resin 107, colored particles 109 are mixed as color filters.

The white light by the mixture of the bluish light and the yellowish light described above is changed by the color of the colored particle 109 by the subtractive color mixing consequently, by selecting the color of the colored particles 109, desired color light is produced. Thus, the LED device 130 is provided to produce various color light.

FIG. 22 is a perspective view showing a back light unit for illuminating an LCD (liquid crystal display), FIG. 23 is a sectional view of the back light unit.

The back light unit 140 comprises a pair of white light emitting LED devices 120 shown in FIG. 18, a lighting panel 142, a diffusion panel 143, a Py prism sheet 144, a Px prism sheet 145, a reflection plate 146, and a color LCD 147.

The lighting panel 142 is made of a transparent plastic and has an upper surface 142a, lower surface 142b and front side 142c. The white light emitting LED devices 120 are mounted on an LED substrate 120b and disposed opposite the front side 142c as edge light. The diffusion panel 143 is disposed above the upper surface 142a of the lighting panel 142 and the reflection plate 146 is disposed below the lower surface 142b.

The white light emitted from the LED devices 120 enters the lighting panel 142 from the front side 142c. The entered light is repeatedly reflected by the upper and lower surfaces 142a and 142b. The light is diffusely reflected by the prism surface of the lower surface 142b and discharged from the upper surface 142a. Instead of prism, a crease or uneven surface may be used.

The discharged direction of the light is arranged in a small range by the diffusion panel 143, and further arranged by the prism sheets 144 and 145 in the Y and X-directions, and finally arranged in the Z-direction. The light arranged in the Z-direction illuminates the LCD 147.

In such an illuminating device, LCDs vary in the characteristic of the color filter provided therein. Namely, the color filter characteristic varies with the manufacturer.

On the other hand, the chromaticity of the picture displayed on the LCD is determined by the characteristic of the color filter and the chromaticity of the white LED device 120 illuminating the LCD. The relationship between the characteristics will be described with reference to a drawing hereinafter.

FIG. 24 is a graph of CIE chromaticity. Here, x-coordinate designates proportion of R (Red), y-coordinate designates proportion of G (Green). If proportion of B (Blue) is designated by z, there is the following relationship therebetween.

$$x+y+z=1$$

The point c0 in the graph is chromaticity point where the ratio of R, G and B is 1:1:1.

Coordinates of the point c0 are about x=0.33, y=0.33, z=0.33. The point b0 is a coordinate point of an aim chromaticity of the white LED device, and the reference letter B designates an allowable range of the point b0. The coordinates of the point b0 are x=0.313 and y=0.308. The point d0 is a chromaticity point of the wavelength transmittance of the color filter of the LCD. The coordinates are x=0.352 and y=0.357. The point d0 has a complementary color relation to the point b0. The reference letter D designates a dispersion range of the point d0.

If the chromaticity of the white LED device 120 is the chromaticity at the point b0 or a value in the allowable range B, the light from the white LED device 120 transmits the color filter having a chromaticity of the point d0 or a value in the range D, so that the light is corrected to light having a chromaticity based on the white light designated at the point c0.

However, the chromaticity of the light emitted from the white LED device 120 varies according to dispersion of the wavelength and intensity of the light emitted from the LED 105 and dispersion of the distribution of particles in the resin 107 of the product.

The average values of coordinates of actually manufactured white LED devices are x=0.295 and y=0.290, and the dispersion is σx=0.015 and σy=0.01.

The point f0 in FIG. 24 designates an average chromaticity of the above described products. F designates a range of the dispersion. Therefore, actual products each having chromaticity in the desired range B is a very small percentage of all products. Thus, the yield of the white LED device is very low.

SUMMARY OF THE INVENTION

An object of the present invention is to provide an LED device having a constant chromaticity.

According to the present invention, there is provided a LED device comprising an LED mounted on a substrate, a transparent resin including phosphor particles for changing a color of light emitted from the LED, and the transparent resin is colored by a dye at least on the surface of the transparent resin and the dye is for correcting the changed color to a desired color.

The dye has a color for correcting the color of the light emitted from the LED.

Further, the dye has a complementary color to the color of the light emitted from the LED.

Furthermore, the present invention provides a method for manufacturing an LED device comprising the steps of mounting an LED on a substrate, sealing the LED with a transparent resin including phosphor particles to form an LED intermediate device, measuring chromaticity of light from the LED device before being dyed, dyeing the transparent resin to acquire a desired color, the dye having a color for correcting the measured chromaticity to a desired chromaticity.

The transparent resin is colored at least on the surface.

Further, the dye has a complementary color to the measured chromaticity.

These and other objects and features of the present invention will become more apparent from the following detailed description with reference to the accompanying drawings.

DETAILED DESCRIPTION OF THE PREFERRED EMBODIMENT

Figure 1:
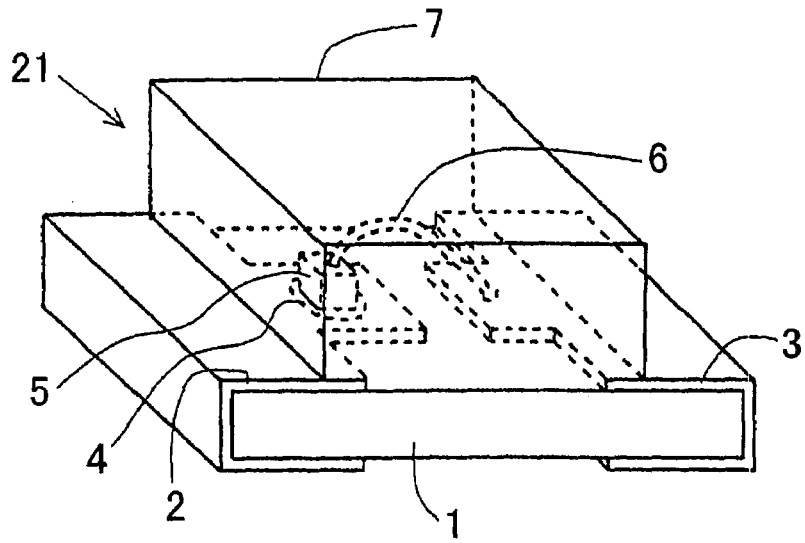
FIG. 1 is a perspective view of an LED device according to the present invention.
Figure 2:
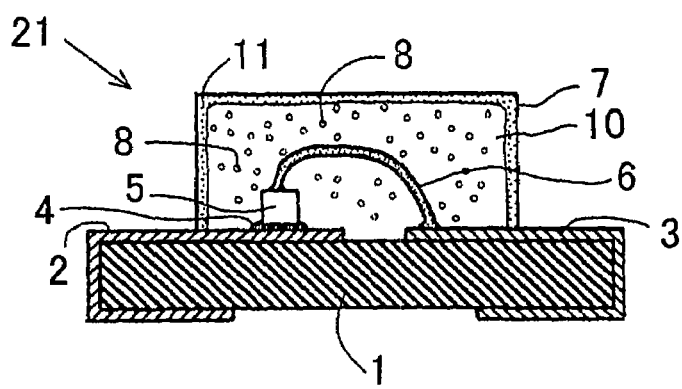
FIG. 2 is a sectional view of the LED device.

FIG. 1 is a perspective view of an LED device according to the present invention, and for emitting white light, FIG. 2 is a sectional view of the LED device.

The light emitting LED device 21 comprises a substrate 1 having a pair of terminal electrodes 2 and 3 provided on the upper surface and the underside thereof, and a blue LED 5 for emitting blue light. The cathode of the LED 5 is connected to the electrode 2 through an adhesive 4, and the anode is connected to the electrode 3 by a bonding wire 6. A transparent resin 7 is provided for sealing the LED 5 and the upper surface of the substrate 1. The transparent resin 7 comprises a white light producing portion 10 and a colored portion 11 for producing desired color light. In the portion 10, yellow phosphor particles or R, G or B phosphor particles 8 are mixed. In the colored portion 11, coloring dye is permeated.

A method for manufacturing the desired LED device will be described hereinafter.

Figure 3:
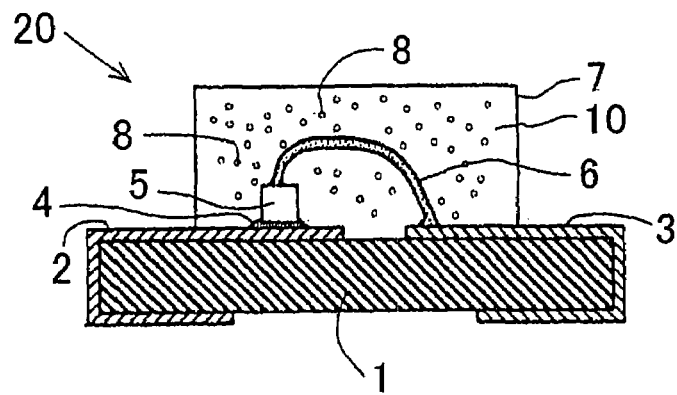
FIG. 3 is a sectional view showing a step for manufacturing the LED device.

FIG. 3 is a sectional view showing a step for manufacturing the LED device.

The terminal electrodes 2 and 3 are formed on the upper surface and the underside surface of the substrate 1 by the metalizing method. The cathode of the LED 5 is connected to the electrode 2 through the adhesive 4, and the anode is connecting to the electrode 3 by the bonding wire 6. The LED 5 and the upper surface of the substrate 1 are sealed by the white light producing resin 7 including the yellow phosphor particles 8.

Thus, a white LED device 20 is produced.

Next, the chromaticity of the white light emitted from the white LED device is photoelectrically measured to select LED devices which are out of a desired chromaticity. A color dye for reducing the unnecessary color of the light emitted from the defective LED devices is determined and permeated in the resin 7; thereby forming the colored portion 11. Thus, a white LED completed device 21 is produced.

Next, the above described method is more particularly described hereinafter.

Figure 4:
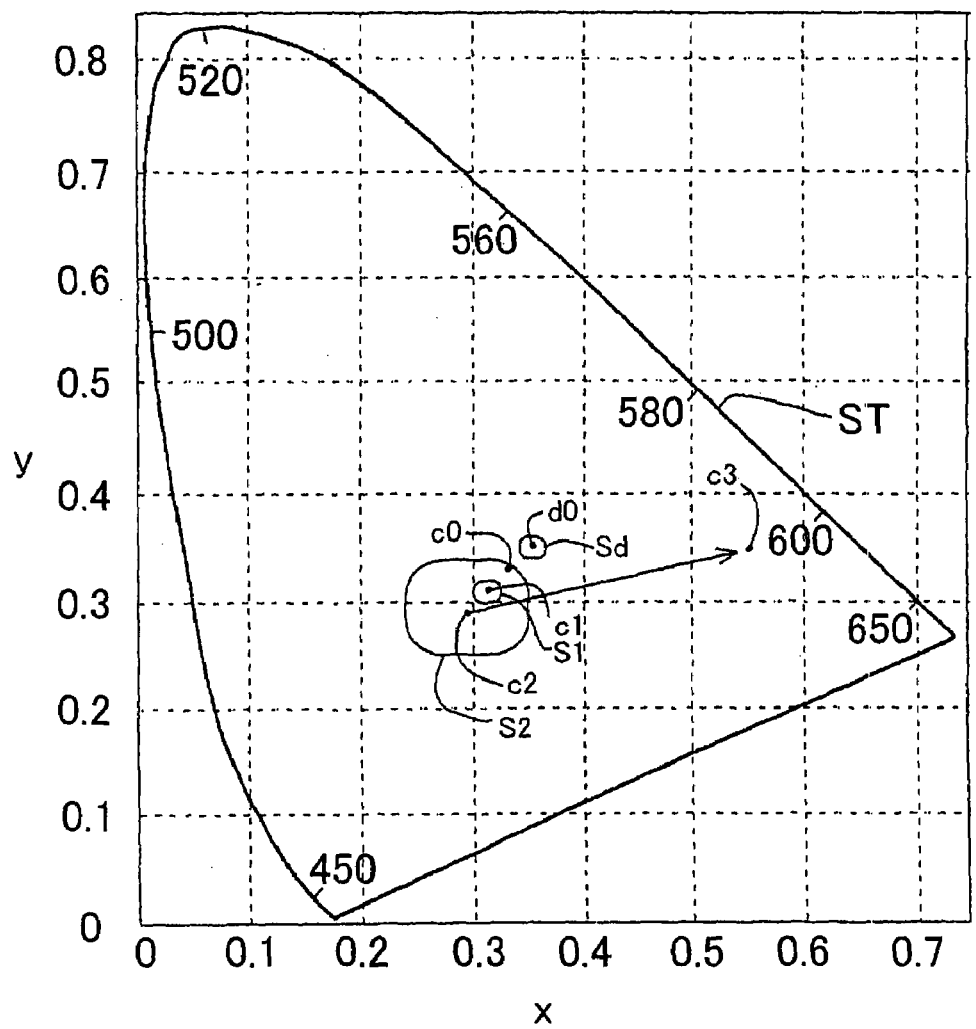
FIG. 4 is a graph of chromaticity of an LED device.

FIG. 4 is a graph of chromaticity of an LED device.

The point c2 in FIG. 4 designates coordinate of an average chromaticity of the light emitted from the white LED device 20 where x=0.295 and y=0.290. The letter S2 designates a range of the dispersion where σx=0.015, σy=0.01 in a range of 3σ(N=10K). The chromaticity point c1 is a coordinate point of an aim chromaticity of the white LED device, and the reference letter S1 designates an allowable range of the point c1. The coordinates of the point c1 are x=0.313 and y=0.308. The range S1 has a dispersion of σx=0.005 and σy=0.003 about the point c1 (range of 3σ).

Here, a range S2 is determined as an allowable range and a white LED device having chromaticity in the range S2 is photoelectrically picked up as an available device. Picked up LED devices are classified into four classes a, b, c, d. Namely, the white LED device emitting bluish white light is classified into the class a, the device emitting yellowish white light is classified into the class b, the device of reddish light is into the class c, and greenish is into the class d.

Colored dye of complementary color to the classified color is selected and transmitted in the resin 7 as described hereinafter in detail.

Figure 5:
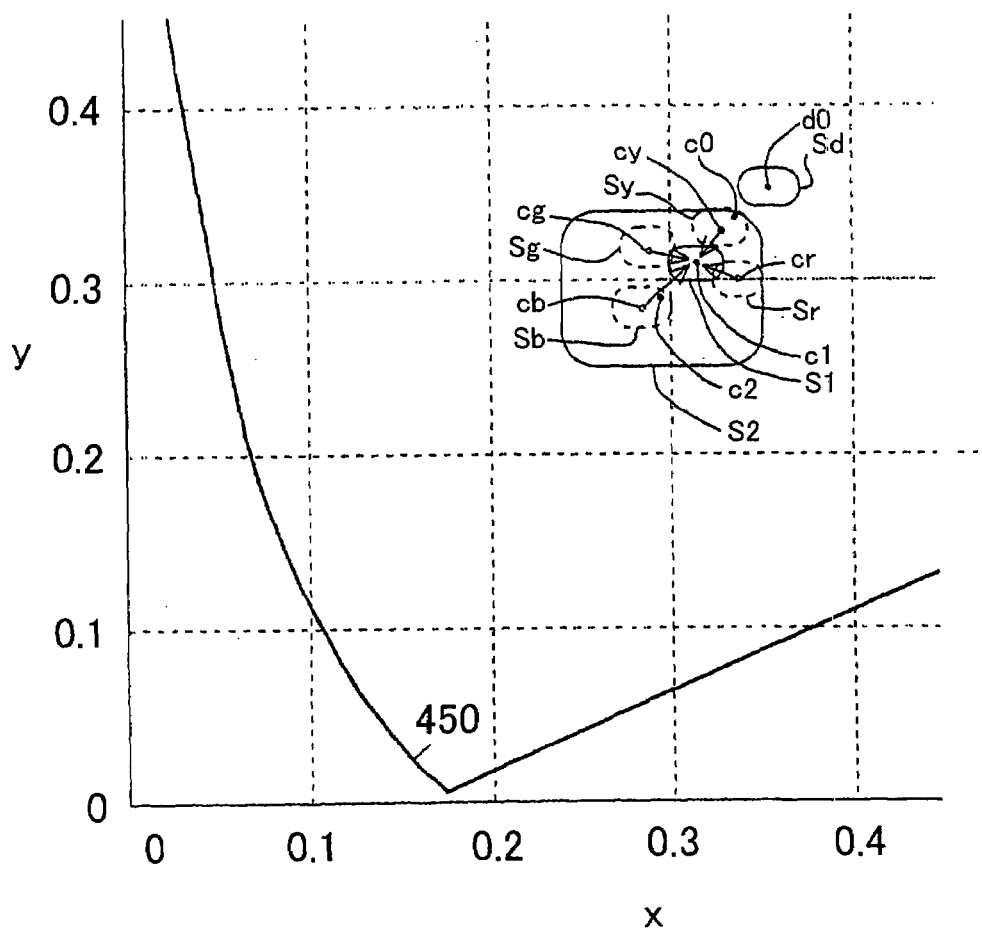
FIG. 5 is an enlarged view of the graph of FIG. 4.

FIG. 5 is an enlarged view of the graph of FIG. 4. The chromaticity point cb designates coordinates of the class a of the bluish white light, where x=0.286 and y=0.281. For the white LED device at the point cb, yellow dye of naphthoquinone group was selected as a complementary color. The white LED device 20 was immersed in a dye liquid comprising alcohol including yellow dye of 100 ppm for fifteen minutes while stirring, thereby transmitting the dye in the resin 7 to form the colored portion 11. Thus, the white LED completed device 21 was produced. The chromaticity of the LED device 21 was that of the desired point c1. The coordinates were x=0.313 and y=0.308 of the point c1.

Figure 6:
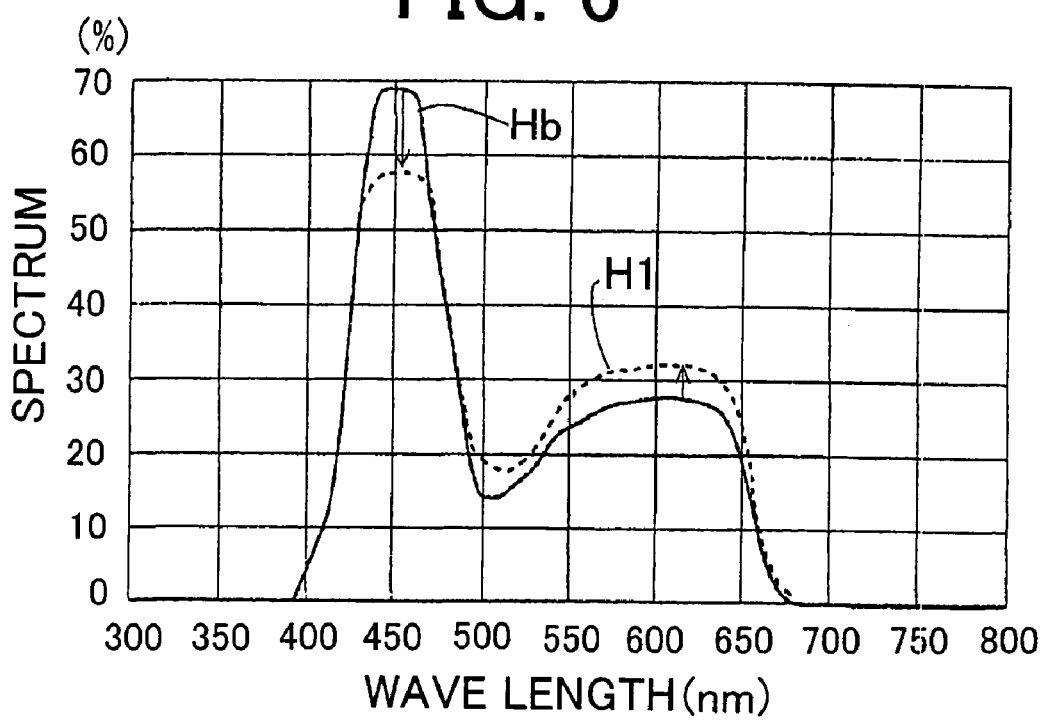
FIG. 6 is a graph of spectrum at chromaticity point cb and chromaticity point c1.

FIG. 6 is a graph of spectrum at chromaticity point cb and chromaticity point c1 which are shown by lines Hb and H1. In the graph, R component is a part at 625 nm, G component is a part at 560 nm and B component is a part at 450 nm.

The color correction of the bluish white light is based on the subtractive mixture of the yellow of the dye as the subtractive complementary color as the following description.

Figure 7:
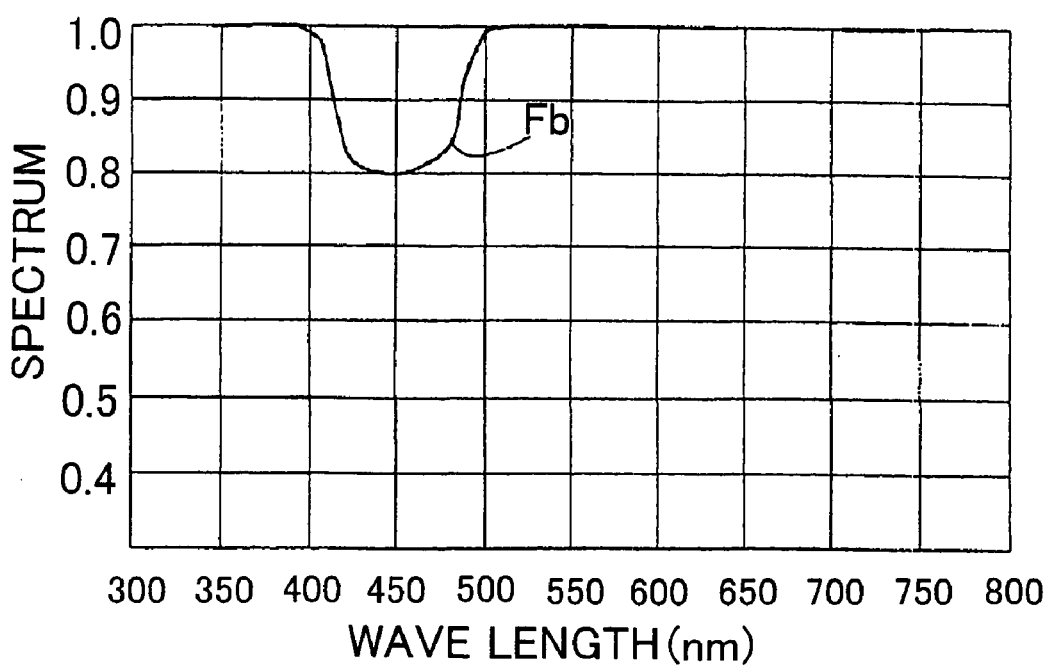
FIG. 7 is a graph showing spectrum of a color filter of a dye.

FIG. 7 is a graph showing spectrum of the color of the dye. The spectrum Fb in FIG. 7 shows the ratio of the filter characteristic R:G:B of the yellow dye in the colored portion 11 is R:G:B=1:1:0.80. By the ratio, the ratio R:G:B=0.28:0.276:0.444 of the white LED device 20, which corresponds to the chromaticity point cb, is corrected to ratio R:G:B=0.286×1:0.281×1:0.433×0.80=0.313:0.308:0.379. Thus, the white LED device 21 having the chromaticity at the point c1 was produced.

Next, a white LED device 20 having a chromaticity in the range Sb was corrected in chromaticity in a condition similar to the above described condition. As a result, the chromaticity of the light emitted from the LED device was corrected to a value within the range S1 around the desired chromaticity at the point c1.

Figure 8:
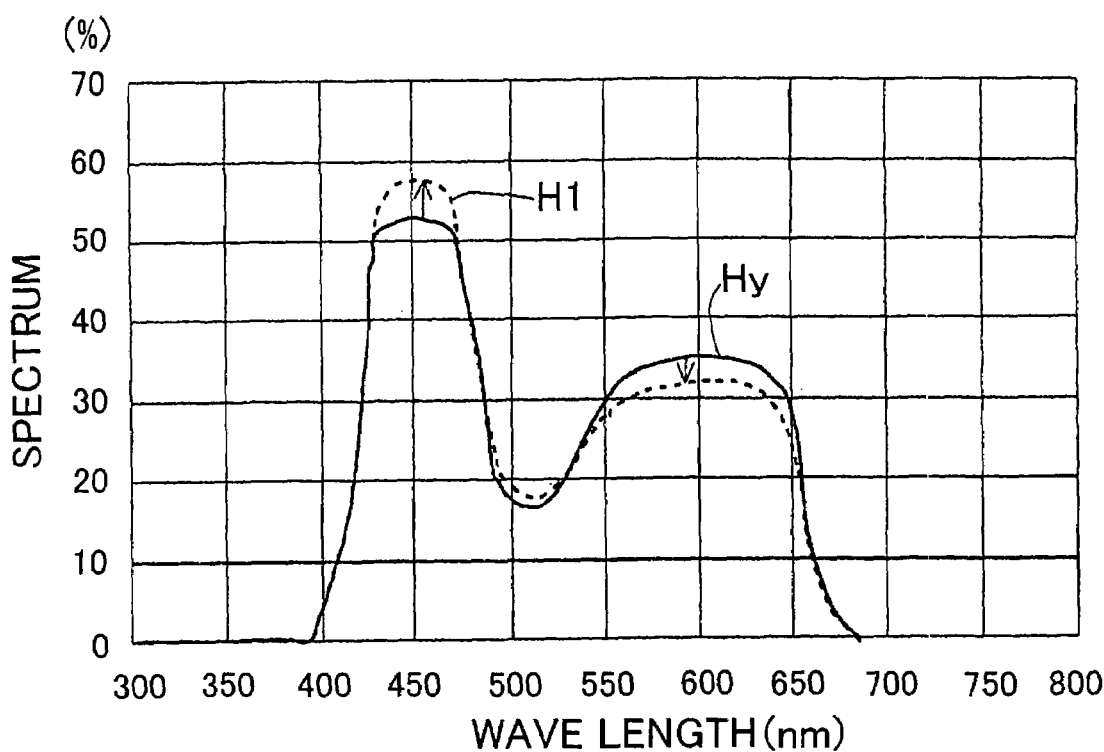
FIG. 8 is a graph showing spectrum of the color filter.

Chromaticity of a white LED device 20 having a chromaticity of a yellowish white was corrected. The chromaticity was in the range Sy around the chromaticity point cy of x=0.328, y=0.328 in FIG. 5. FIG. 8 is a graph showing spectrum of the color filter. The spectrum corresponding to the point cy is shown by Hy in FIG. 8.

Figure 9:
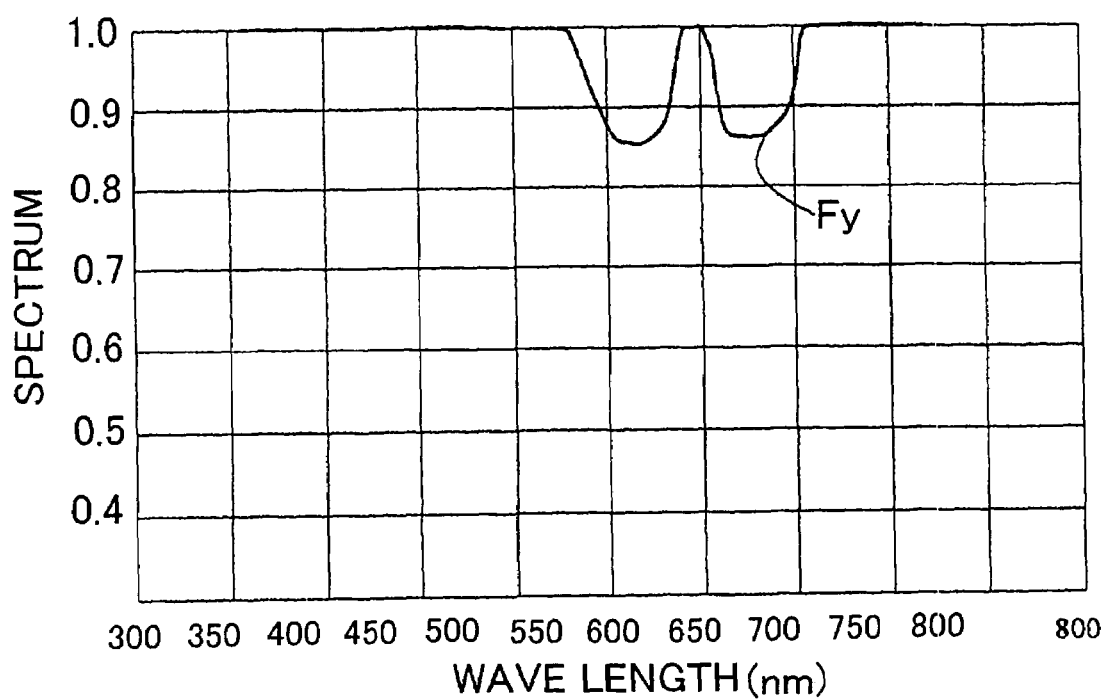
FIG. 9 is a graph showing spectrum of a color filter of a dye.

For the white LED device at the point cy, blue dye of anthraquinone group was selected. The white LED device 20 was immersed in a dye liquid comprising alcohol including blue dye of 100 ppm for ten minutes, thereby transmitting the dye in the resin 7 to form the colored portion 11. Thus, a white LED completed device 21 was produced. The colored portion 11 has a filter characteristic shown by a reference letter Fy in FIG. 9. The ratio of R, G, B is R:G:B=0.866:0.853:1 which is a blue filter.

By the color correction effect, the ratio R, G, B of the chromaticity point cy (0.328:0.328:0.344) was corrected to ratio R:G:B=0.328×0.866:0.328×0.853:0.358×1=0.313:0.308:0.379. This is the chromaticity of the point c1.

Similarly, the chromaticity of LED device in the range Sy was also corrected to the chromaticity point in the range S1.

Figure 10:
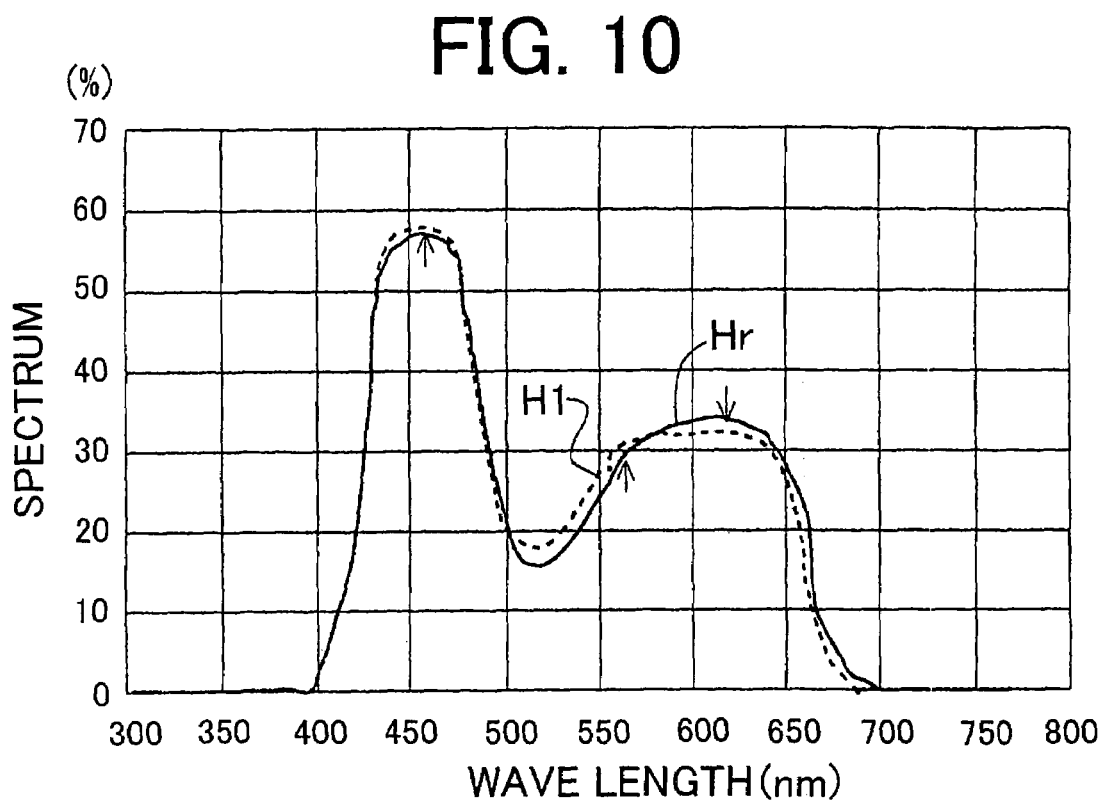
FIG. 10 is a graph showing spectrum of the color filter.

Next, chromaticity of a white LED device 20 having a chromaticity of a reddish white was corrected. The chromaticity was in the range Sr around the chromaticity point cr of x=0.33, y=0.30 in FIG. 5. FIG. 10 is a graph showing spectrum of the color filter. The spectrum corresponding to the point cr is shown by Hr in FIG. 10.

For the white LED device at the point cr, yellow dye of the naphthoquinone group, and blue dye of anthraquinone group were selected. The white LED device 20 was immersed in a dye liquid comprising alcohol including yellow dye of 50 ppm and blue dye of 50 ppm for five minutes, thereby transmitting the dyes in the resin 7 to form the colored portion 11. Thus, the white LED device 21 was produced by the summation effect of the yellow filter and the blue filter. The yellow filter characteristic is shown by a reference letter Fr1 in FIG. 11. The ratio of R, G, B is Ry:Gy:By =0.923:1:0.85 which is a yellow filter. The blue filter characteristic is shown by a letter Fr2 in FIG. 11. The ratio of R, G, B is Rb:Gb:Bb=0.858:0.858:1.

Figure 11:
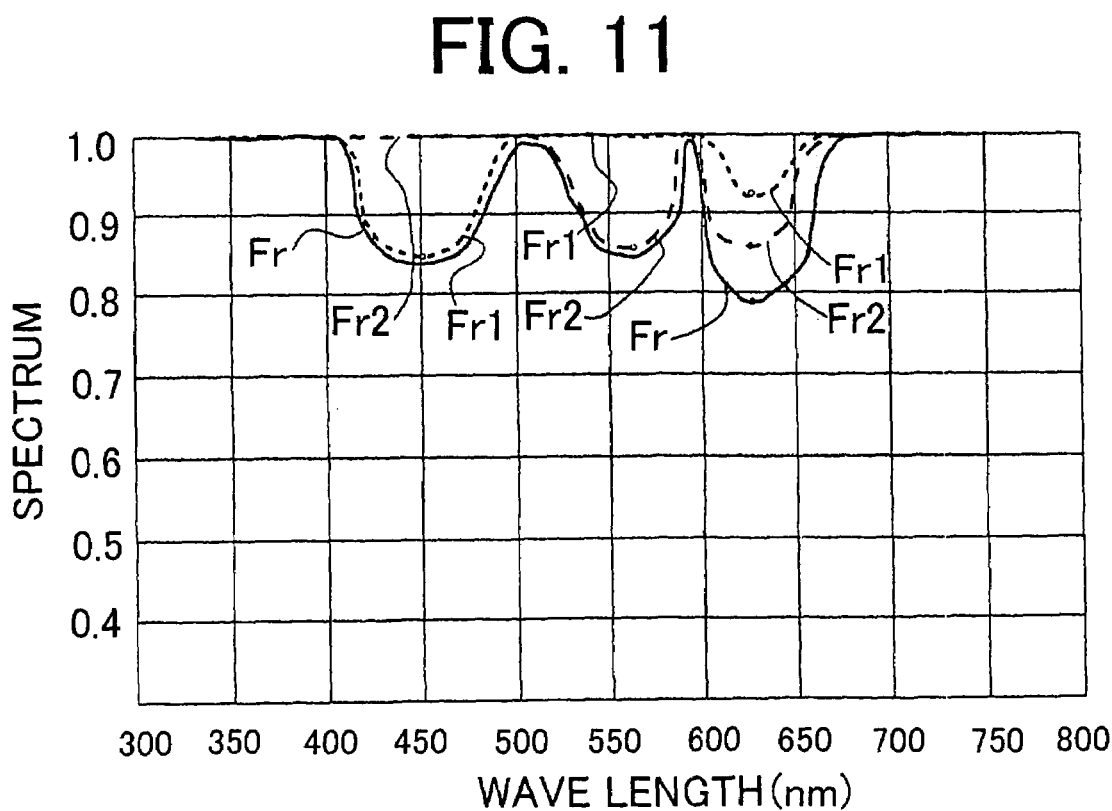
FIG. 11 is a graph showing spectrum of a color filter of a dye.

The filter characteristics are added by the subtractive mixture to provide a total filter characteristic which is shown by the letter Fr in FIG. 11. The ratio R, G, B is Rf:Gf:Bf=Ry×Rb:Gy×Gb:By×Bb=0.923×0.858:0.858:0.85=0.792:0.858:0.85.

In this case, the ratio of R, G, B (0.33:0.30:0.37) in the chromaticity of the point cr was corrected by the color filter in the colored portion 11. The ratio in the corrected chromaticity is R:G:B=0.33×0.792:0.30×0.858:0.37×0.85=0.314:0.309:0.377.

The coordinates of the chromaticity become x=0.314 and y=0.309 which are nearly equal to those of the desired chromaticity c1.

A white LED device 20 having a chromaticity in the range Sr was corrected in chromaticity in a condition similar to the above described condition. As a result, the chromaticity of the light emitted from the LED device was corrected to a value within the range S1 around the desired chromaticity at the point c1.

Figure 12:
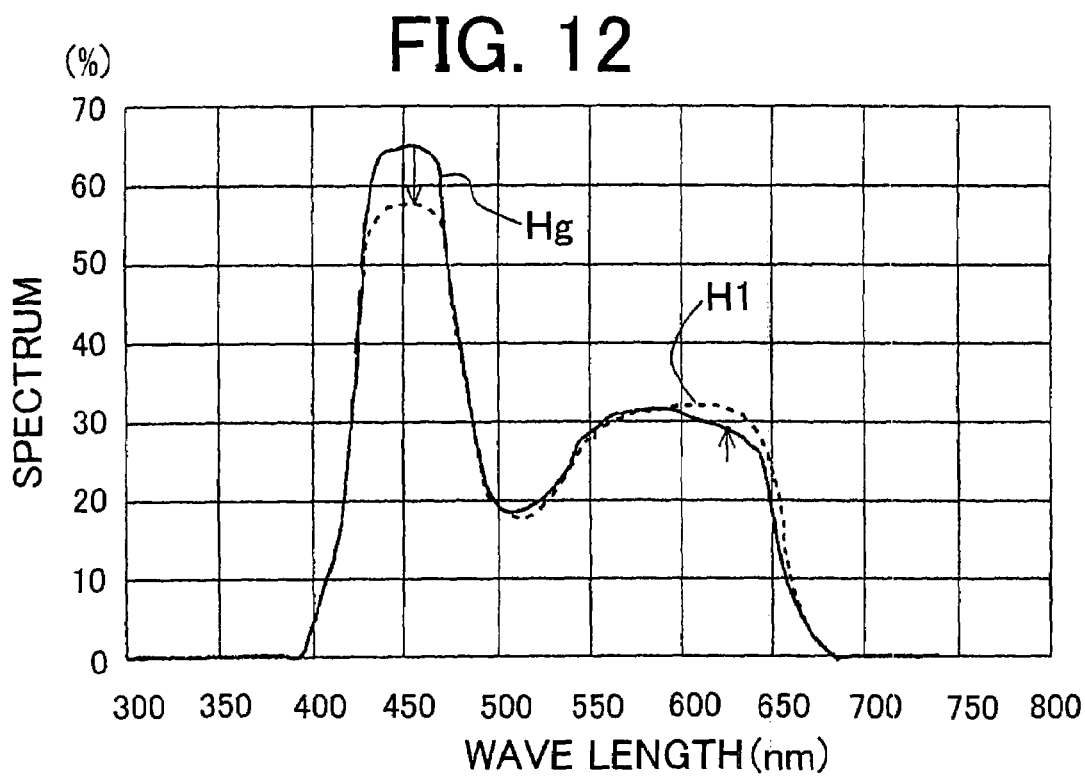
FIG. 12 is a graph showing spectrum of a color filter of a dye.

Next, chromaticity of a white LED device 20 having a chromaticity of a greenish white was corrected. The chromaticity was in the range Sg around the chromaticity point cg of x=0.29, y=0.315 in FIG. 5. FIG. 12 is a graph showing spectrum of the color filter. The spectrum corresponding to the point cg is shown by Hg in FIG. 12.

For the white LED device at the point cg, red dye of monoazo group was selected. The white LED device 20 was immersed in a dye liquid comprising alcohol including red dye of 70 ppm for ten minutes, thereby transmitting the dye in the resin 7 to form the colored portion 11. Thus, the white LED completed device 21 was produced.

As a result, the chromaticity at the point cg was corrected to a chromaticity nearly equal to that of the point c1 (x=0.313, y=0.308). Further, the chromaticity in the range Sg was corrected to a chromaticity in the desired range S1. This is caused by the following reason.

Figure 13:
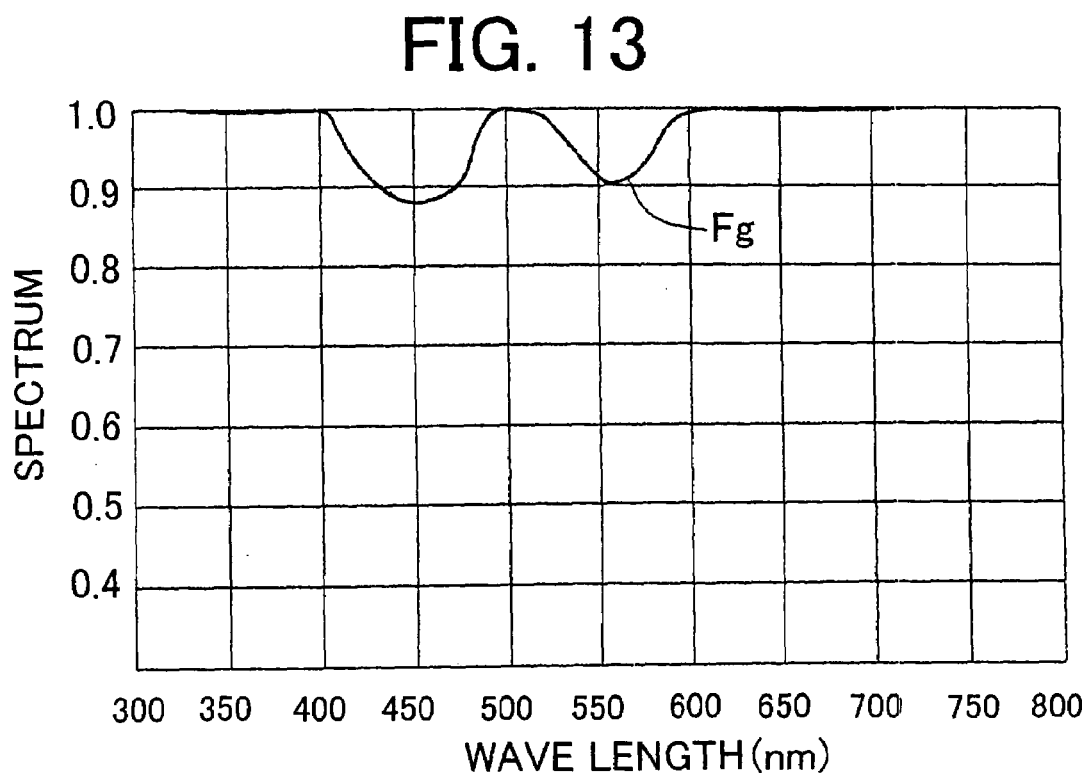
FIG. 13 is a graph showing spectrum of a color filter of a dye.

By the red dye, the filter characteristic was changed as shown by Fg in FIG. 13. Namely, the ratio of filter characteristics R, G, B is changed to red group, Rr:Gr:Br=1:0.906:0.889. Consequently, the chromaticity at the point cg is corrected. Namely, the ratio R, G, B at the point cg is corrected from 0.29:0.315:0.395 to R:G:B=0.29×1:0.315×0.906:0.395×0.889=0.313:0.308:0.379.

As described above, if a chromaticity of a white LED device 20 is deviated from the desired chromaticity range S1, the chromaticity can be corrected to a chromaticity in the desired chromaticity range by the selected filter provided in the colored portion 11. In general, in the case that the ratio R, G, B in the chromaticity of a white LED device 20 is R2:G2:B2, the ratio R, G, B in the desired chromaticity R1:G1: B, and the ratio R, G, B of the filter characteristic of the dye in the colored layer 11 is r:g:b, $$R2 \times r : G2 \times g : B2 \times b = R1 : G1 : B1 \tag{1}$$

If the filter characteristic r:g:b is set to satisfy the formula (1), a desired chromaticity can be provided. The filter characteristic ratio R, G, B of r:g:b can be set to a desired value by selecting the color of the dye, kind of the solution, concentration, immersion time.

Chromaticity of a plurality of white LED devices 20 having various chromaticities were measured. Average coordinates of chromaticity were x=0.313, y=0.308, σx=0.005, σy=0.003. The coordinates were in the desired chromaticity range S1.

Figure 14:
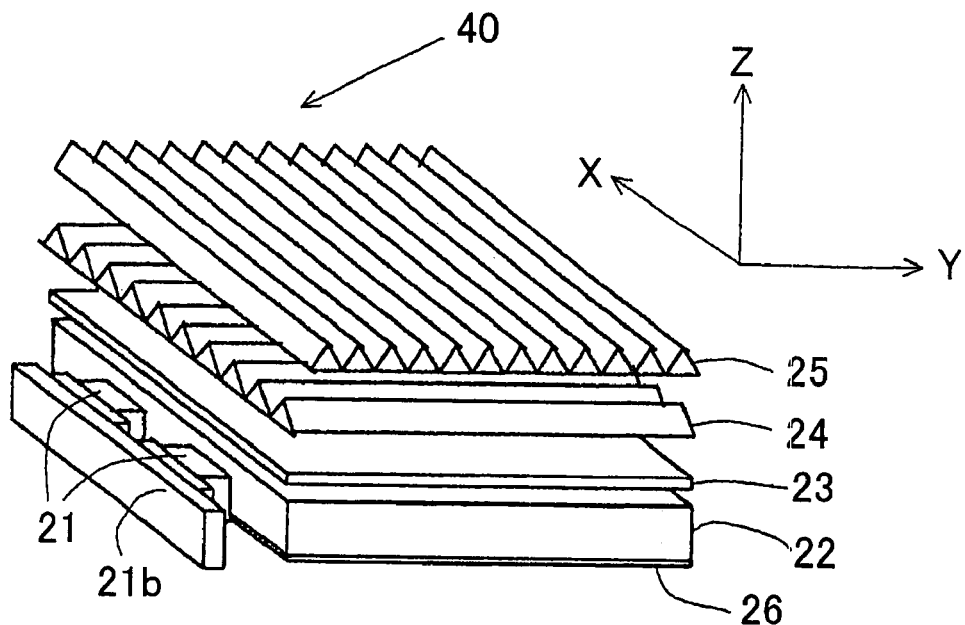
FIG. 14 is a perspective view showing a back light unit for illuminating an LCD in which a white LED complement device is used.
Figure 15:
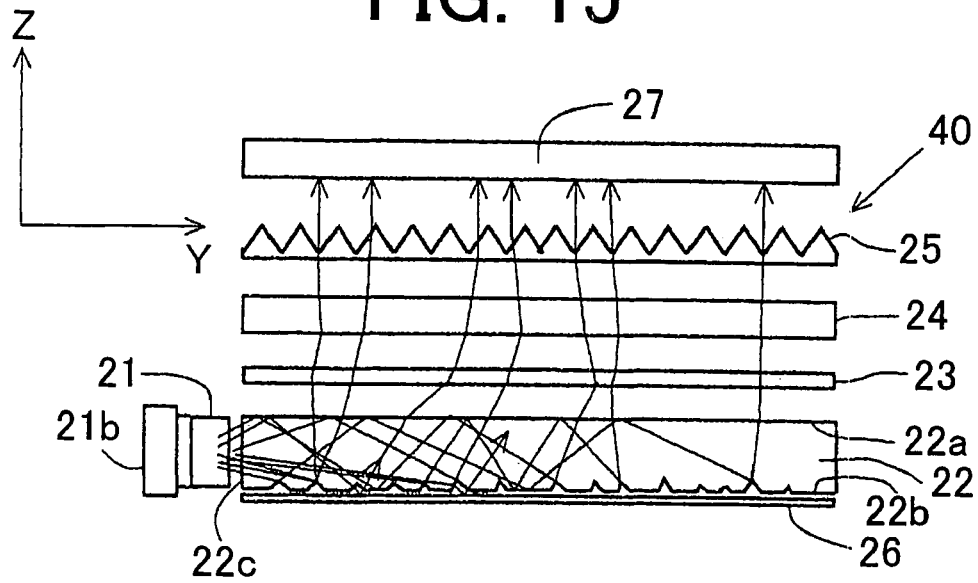
FIG. 15 is a sectional view of the back light unit.

FIG. 14 is a perspective view showing a back light unit for illuminating an LCD (liquid crystal display) in which the white LED completed device 21 is used, FIG. 15 is a sectional view of the back light unit.

The back light unit 40 comprises a pair of white light emitting LED devices 21, a lighting panel 22, a diffusion panel 23, a Py prism sheet 24, a Px prism sheet 25, a reflection plate 26, and a color LCD 27.

The lighting panel 22 is made of a transparent plastic and has an upper surface 22a, lower surface 22b and front side 22c. The white light emitting LED devices 21 are mounted on an LED substrate 21b and disposed opposite the front side 22c as edge light. The diffusion panel 23 is disposed above the upper surface 22a of the lighting panel 22 and the reflection plate 26 is disposed below the lower surface 22b.

The white light emitted from the LED devices 21 enters the lighting panel 22 from the front side 22c. The entered light is repeatedly reflected by the upper and lower surfaces 22a and 22b. The light is diffusely reflected by the prism surface of the lower surface 22b and discharged from the upper surface 22a. Instead of prism, a crease or uneven surface may be used.

The discharged direction of the light is arranged in a small range by the diffusion panel 23, and further arranged by the prism sheets 24 and 25 in the Y and X-directions, and finally arranged in the Z-direction. The light arranged in the Z-direction illuminates the LCD 27.

The chromaticity of the illuminating light is the same as that of the white LED device 21. The coordinates of the chromaticity are the coordinates of the chromaticity point c1 in FIG. 5, x1=0.313, y1=0.308 (z1=0.379).

The chromaticity of the transmittance of the color filter in the color LCD 27 is the chromaticity at a chromaticity point d0 in FIG. 4. The coordinates of the point d0 are xf=0.352, yf=0.357 (zf=0.291).

The ratio R, G, B of the illuminating light color to the LCD 27 is as follows from the chromaticity (x1, y1, z1) of the white LED device 21 and the chromaticity (xf, yf, zf) of the color filter in the LCD 27.

$$R:G:B = x1 \times xf : y1 \times yf : z1 \times zf = 0.313 \times 0.352 : 0.308 \times 0.352 : 0.379 \times 0.291 = 0.333 : 0.333 : 0.334$$

Chromaticity coordinates of the illuminating color to the LCD 27 are x=0.333, y=0.333 (z=0.334) which are nearly white.

Although two white LED devices 21 are used, the dispersion of the chromaticities between the LED devices are σx=0.005, σy=0.003 as described before, which is a very small range. Therefore, the effect will be same even if three or more LED devices are used in the back light unit 40.

An LED device of a second embodiment of the present invention will be described hereinafter. The LED device of the second embodiment is provided for emitting color light other than white light.

The construction of the LED device is the same as the first embodiment.

An example of a method for producing an LED completed device having a chromaticity point c3 (x=0.55, y=0.35, z=0.1) from an LED device having a chromaticity point c2 (x=0.295, y=0.29, z=0.415) is described hereinafter.

The filter characteristic of the colored layer 11 of the LED completed device is calculated from the ratio of R, G, B in the chromaticities at the points c2 and c3 by using the formula (1).

In the formula (1), $$R2 \times r : G2 \times g : B2 \times b = R1 : G1 : B1$$

R2:G2:B2=0.295:0.290:0.415 (corresponding to c2) is used as the ratio of R, G, B of the LED intermediate device and R1:G1:B1=0.55:0.35:0.1 (corresponding to c3) is used as the ratio of R, G, B of the LED completed device.

Figure 17:
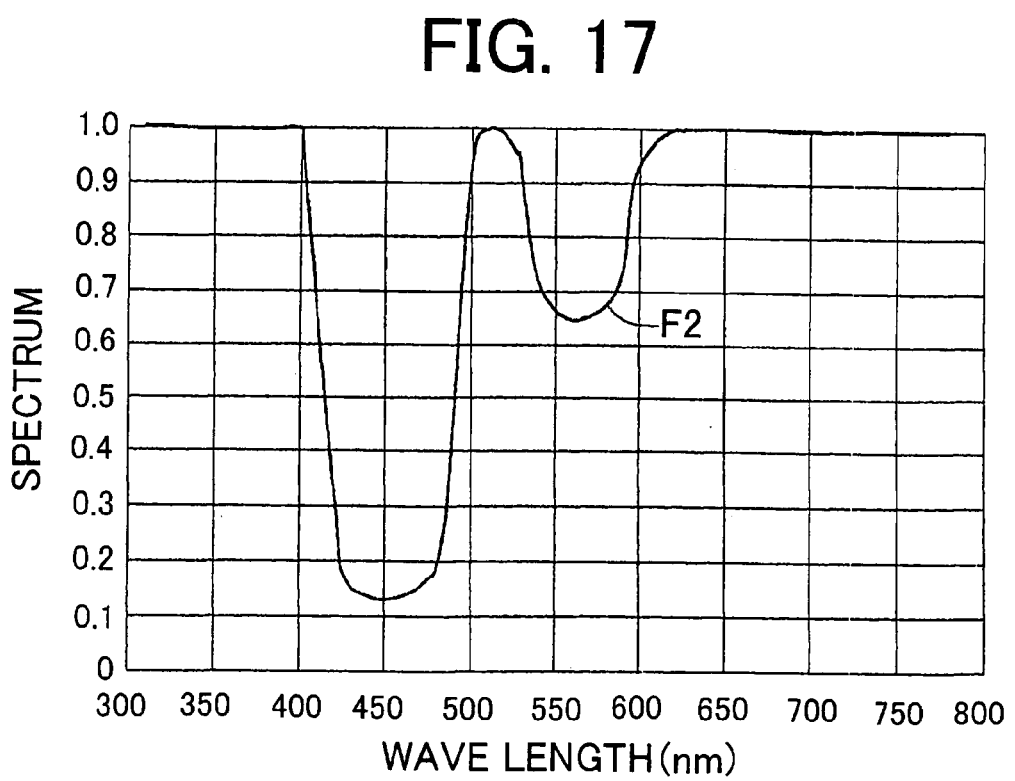
Figure 18:
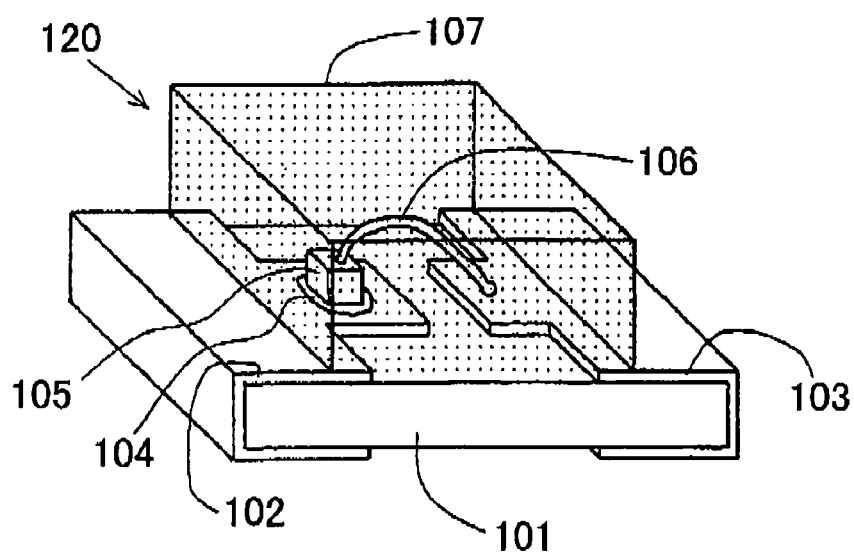
FIG. 18 is a perspective view of a conventional LED device for emitting white light.
Figure 19:
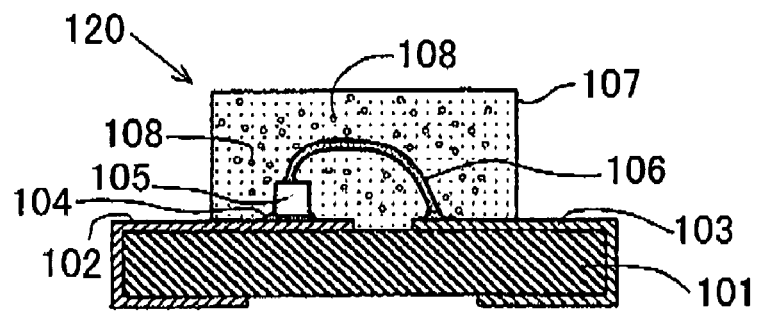
FIG. 19 is a sectional view of the conventional LED device.
Figure 20:
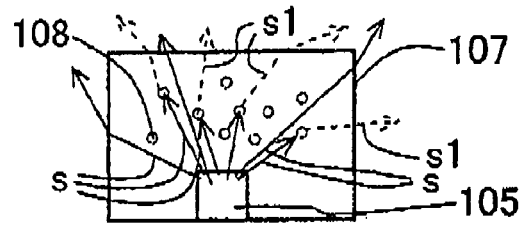
FIG. 20 is a sectional view for explaining the operation of the device.
Figure 21:
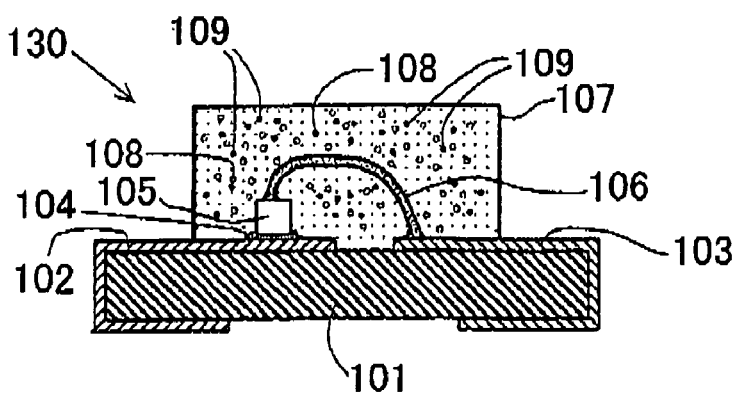
FIG. 21 is a sectional view showing another conventional LED device.
Figure 22:
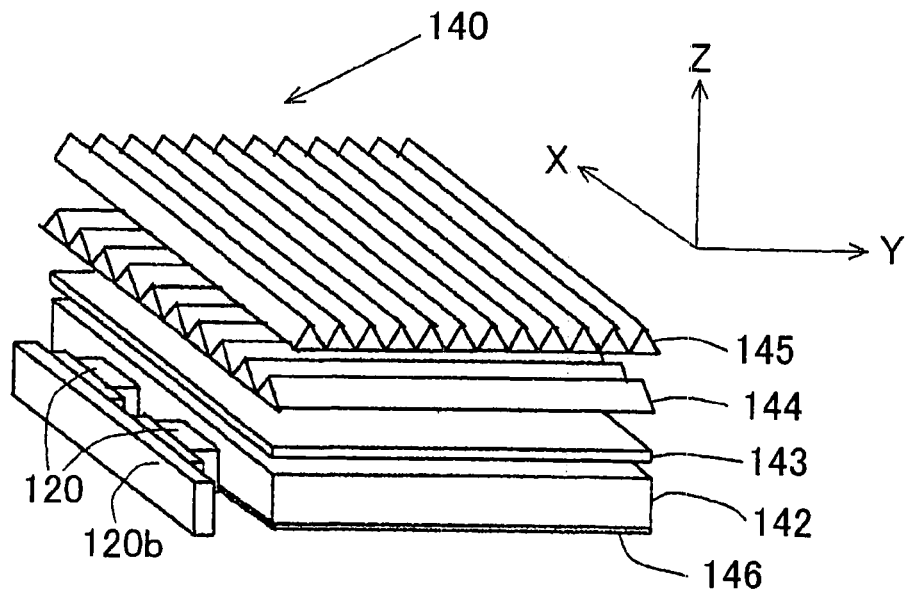
FIG. 22 is a perspective view showing a back light unit for illuminating an LCD.
Figure 23:
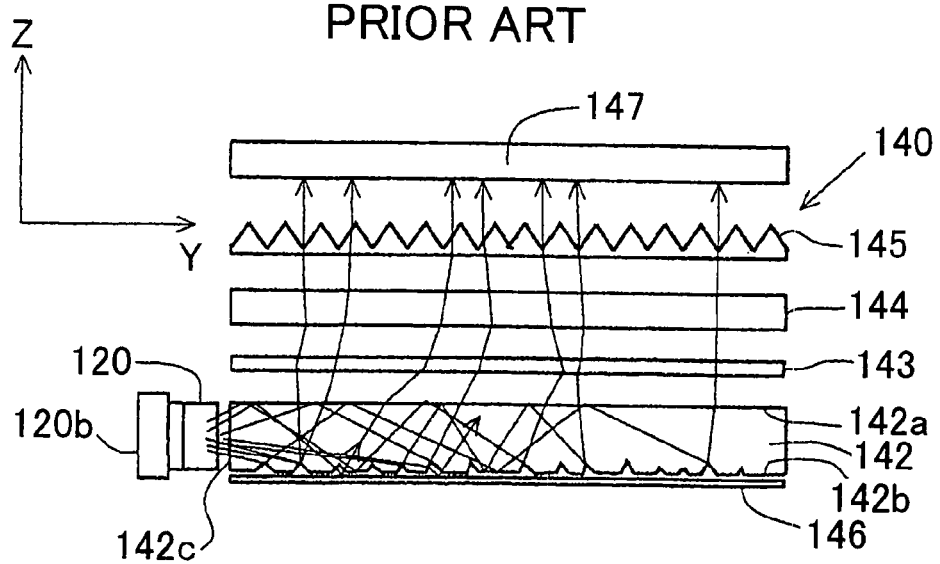
FIG. 23 is a sectional view of the back light unit.
Figure 24:
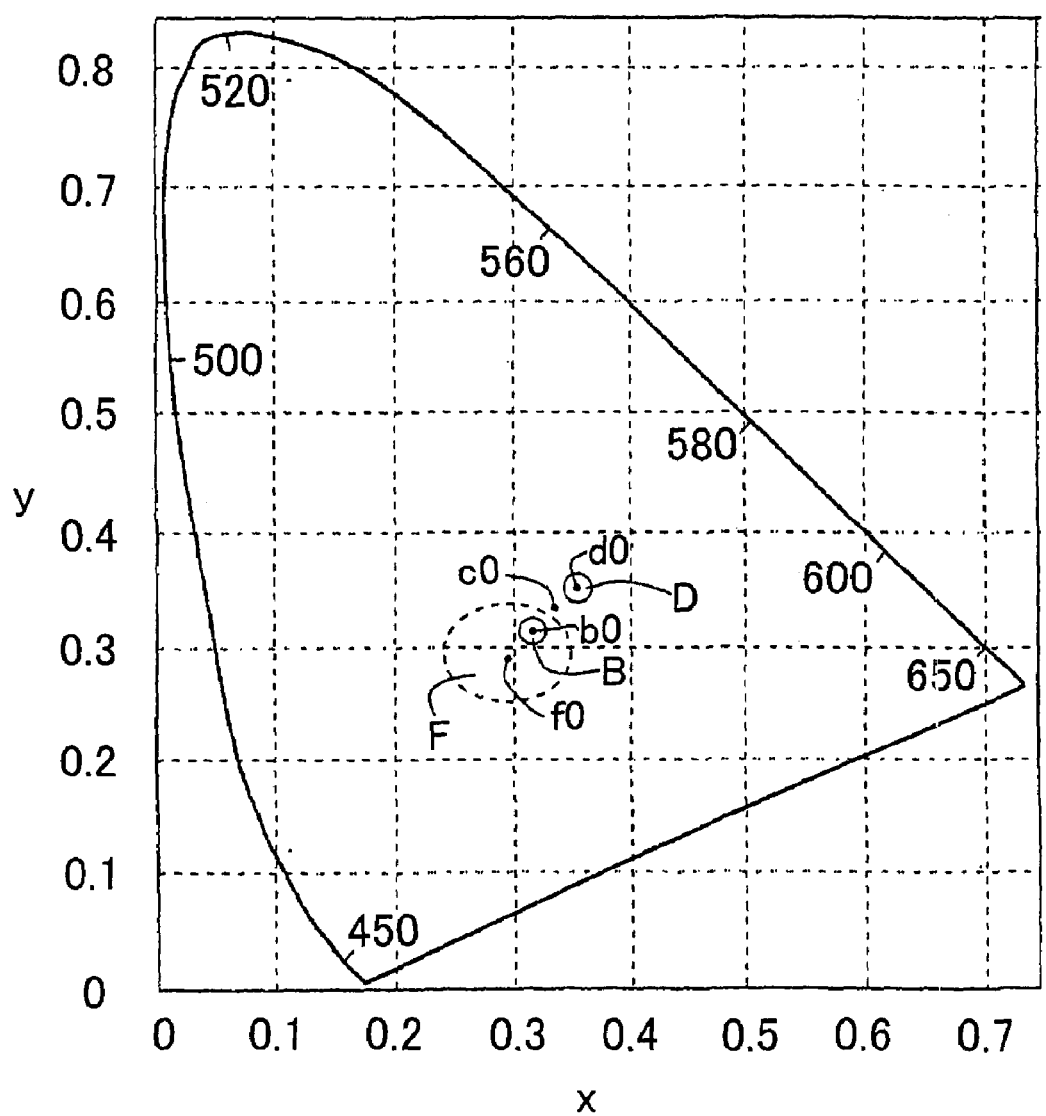
FIG. 24 is a graph of CIE chromaticity.

The filter chromaticity ratio of R, G, B is r:g:b=1:0.647:0.129 from the formula (1). The characteristic is shown in FIG. 17 by F2.

Next, the LED device before being dyed is immersed and mixed in a dye liquid comprising alcohol liquid, red dye and blue dye for a proper time and at a temperature, so that the filter characteristic ratio becomes r:g:b=1:0.647:0.129. Thus, an LED completed device is produced.

Figure 16:
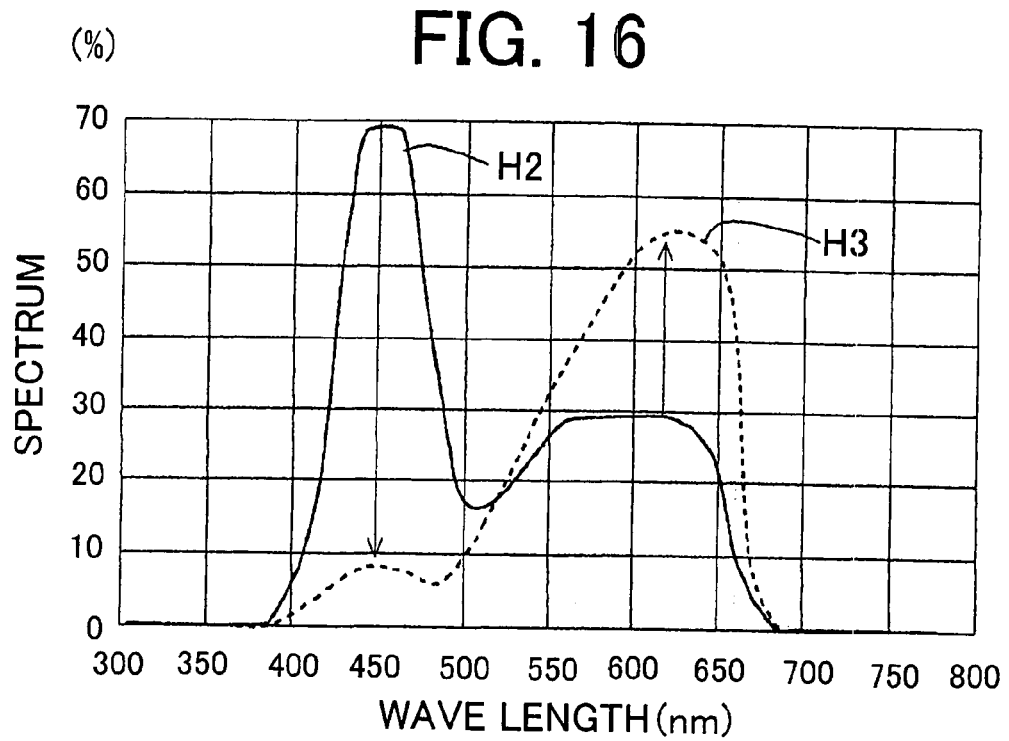
FIGS. 16 and 17 are graphs of spectrum of emitted light from a device of a second embodiment of the present invention.

In FIG. 16, H2 shows a spectrum of the light emitted from the LED device, and H3 shows a spectrum of the light emitted from the LED completed device. As shown by H3, the light has red color.

The line ST in FIG. 4 shows a locus of single color lights. In accordance with the present invention, LED completed devices emitting a plurality of single color lights such as red, yellow, green, blue, violet and others can be produced.

In accordance with the present invention, LED devices each having a desired chromaticity can be produced, so that the yield of the LED device is increased.

While the invention has been described in conjunction with preferred specific embodiment thereof, it will be understood that this description is intended to illustrate and not limit the scope of the invention, which is defined by the following claims.

What is claimed is:

1. A method for manufacturing an LED device comprising the steps of:
   mounting an LED on a substrate;
   sealing the LED with a transparent resin including phosphor particles to form an LED device before being dyed;
   measuring chromaticity of light from the LED device before being dyed; and
   dyeing the sealing resin by a dye having a color for correcting the measured chromaticity to a desired color.

2. The method according to claim 1 wherein dyeing of the transparent resin is controlled by at least one condition selected from the group consisting of the concentration of the dye, the temperature of a liquid in which a dye is put, and the time in soaking the LED device before being dyed in the liquid containing the dye.

* * * * *